METHOD OF FORMING AN OHMIC CONTACT REGION IN A THIN SEMICONDUCTOR LAYER

Filed Jan. 15, 1970

INVENTORS.
ROBERT G. HUNSPERGER,
OGDEN J. MARSH,
BY
Paul M. Coble
ATTORNEY.

United States Patent Office 3,666,567
Patented May 30, 1972

3,666,567
METHOD OF FORMING AN OHMIC CONTACT REGION IN A THIN SEMICONDUCTOR LAYER

Robert G. Hunsperger, Malibu, and Ogden J. Marsh, Woodland Hills, Calif., assignors to Hughes Aircraft Company, Culver City, Calif.
Filed Jan. 15, 1970, Ser. No. 3,156
Int. Cl. H01l 7/54
U.S. Cl. 148—1.5 3 Claims

ABSTRACT OF THE DISCLOSURE

A method of providing an ohmic contact region in a thin doped semiconductor layer is disclosed. After the layer is formed in the semiconductor substrate and the substrate is annealed, impurities are implanted into the layer at room temperature, thereby creating a defect region in the layer which provides good ohmic contact to the layer.

This invention relates to ion implantation of semicondustors generally, and more specifically relates to a method of forming an ohmic contact region in a doped semiconductor layer using ion implantation techniques.

It is well known in the art to provide an ohmic contact to a doped layer in a semiconductor substrate by alloying an electrically conductive material to the layer. However, this process is useful only for a thick layer, i.e., a layer thicker than 1μ. For thinner layers the alloy material will usually penetrate through the layer, causing a short circiut to the substrate.

Another method which has been used to form an ohmic contact on a doped semiconductor layer is to evaporate the contact onto the surface of the layer. However, in instances where a large surface-barrier potential (essentially 0.1 v. or more) exists at the surface of the doped layer, a rectifying contact results. This occurs with N-type conductivity layers in substrates of gallium arsenide, gallium antimonide and indium antimonide, and P-type layers in substrates of indium arsenide, for example.

It is, therefore, an object of this invention to provide an improved method for providing an ohmic contact on a thin doped layer in a semiconductor substrate.

The foregoing and other objects and advantages of the present invention are achieved by forming a doped layer in a semiconductor substrate, annealing the substrate, and implatining impurities into the layer to a depth less than the depth of the layer. The impurity implantation is performed at a temperature below the annealing temperature. Implantation after annealing gives rise to a region of defects within the layer, thereby providing good ohmic contact with the layer.

The invention will be described in greater detail with reference to the accompanying drawing in which.

Figure 1:
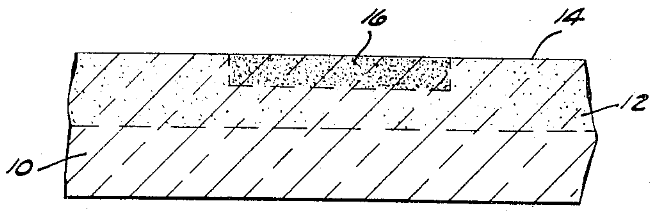
FIG. 1 is a cross-sectional view of a portion of a semiconductor substrate processed in accordance with the method of the invention.

Referring now to FIG. 1, there is shown a portion of a semiconductor substrate 10 having a doped layer 12 formed therein adjacent a surface 14 of the substrate 10. The layer 12 may contain either N-type or P-type conductivity determining impurities. However, the method of this invention is of particular usefulness when a surface-barrier potential of 0.1 v. or more exists at the surface 14. This occurs when the layer 12 is of N-type conductivity and the substrate 10 is of gallium arsenide, gallium antimonide, and when the layer 12 is of P-type conductivity and the substrate 10 is of indium arsendie, for example.

The layer 12 may be formed by ion implantation, diffusion, or any other suitable doping method and may contain any suitable dopant, for example tin, sulphur, zinc, selenium, tellurium, or cadmium, to name but a few. When layer 12 is formed by a high temperature doping method, the substrate is thereby simultaneously annealed, thus obviating the necessity for subsequent annealing. Although the layer 12 may be of any thickness, including the thickness of the substrate itself (this would result from doping the entire substrate, for example), the process of the invention is especially suitable when the thickness of layer 12 is 1μ or less.

A contact region 16 is formed within the layer 12 and adjacent a portion of the surface 14. The contact region 16 is a region in which defects in the crystalline structure of the layer 12 exist. It is formed by implanting impurities into the layer 12 after the layer 12 has been formed in the substrate 10 and the substrate 10 has been annealed. The implantation of impurities into the layer 12 is performed at a temperature less than the annealing temperature of the semiconductor material and gives rise to the defects in the contact region 16. The implanted impurities may be ions of a conductivity determining dopant such as, but not limited to tin, sulphur, selenium, tellurium, phosphorus, gold, zinc, cadmium and aluminum, or atoms of non-conductivity determining dopants such as argon, neon, helium, krypton or xenon. However, these implanted impurities are preferably of the same chemical element as that used to form the doped layer 12.

Figure 2:
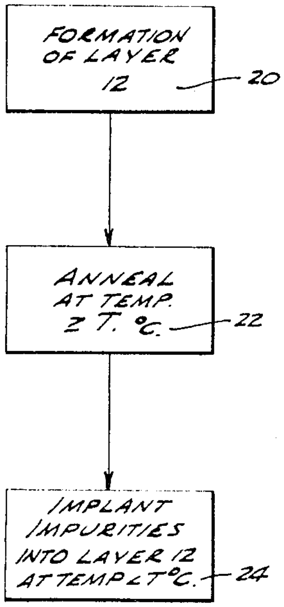
FIG. 2 is a flow diagram depicting the sequence of steps involved in the method of the invention.

Referring now to FIG. 2 as well as FIG. 1, the first step 20 comprises forming the layer 12 in the substrate 10. The next step 22 comprises annealing the substrate 10 in order to remove defects from the crystalline structure of the layer 12. The annealing is performed at a temperature T or greater. When substrate 10 is of gallium arsenide, temperature T is essentially 400° C. or greater.

The third step 24 comprises implanting impurities into the layer 12 to form the contact region 16. This implantation step is performed at a temperature below the annealing temperature T and only after all annealing has been completed. Otherwise, the high temperature of annealing will destroy the desired defects of the contact region 16, and it is precisely these defects which provide a good ohmic conduction path from the surface 14 through the contact region 16 to the layer 12.

It is preferable to perform step 24 at room temperature (usually between 15° C. and 30° C.) because no environmental temperature control is needed. However, the method can be carried out at lower temperatures as well.

In the performance of step 24, care must be taken to insure that the resulting contact region 16 is thinner than the layer 12, or else the contact region 16 will be short circuited to the substrate 10. This can be done by controlling the energy of the impurity implantation beam and the duration of the implantation operation.

Although the method of the invention is most suitable for making contact regions in doped layers of a thickness less than 1μ, it can be employed to provide ohmic contact regions for doped layers of other thicknesses.

Thus, while a specific method has been shown and described herein, variations may be made therein within the spirit, scope and contemplation of the invention.

What is claimed is:

1. A method for forming an ohmic contact region in a semiconductor substrate of a material selected from the group consisting of gallium arsenide, gallium antimonide, indium antimonide and indium arsenide comprising:

forming a doped layer of a thickness less than about 1μ in said substrate, said layer being of N-type conductivity for gallium arsenide, gallium antimonide and indium antimonide, and of P-type conductivity for indium arsenide;

annealing said substrate; and implanting impurities of a non-conductivity determining dopant into said layer to a depth less than the depth of said layer and at a temperature below the annealing temperature to form a defect region in said doped layer.

2. The method claimed in claim 1 wherein the impurity implantation into said layer is performed at a temperature within a range extending essentially from 15° C. to 30° C.

3. The method claimed in claim 1 wherein said impurities are of an element selected from the group consisting of helium, neon, argon, krypton, and xenon.

References Cited

UNITED STATES PATENTS

| | | | |
|---|---|---|---|
| 3,298,863 | 1/1967 | McCusker | 117—212 |
| 3,481,776 | 12/1969 | Manchester | 117—212 |

L. DEWAYNE RUTLEDGE, Primary Examiner

J. M. DAVIS, Assistant Examiner

U.S. Cl. X.R.

317—235 R